United States Patent [19]
Arima et al.

[11] Patent Number: 5,252,847
[45] Date of Patent: Oct. 12, 1993

[54] ELECTRICAL ERASABLE AND PROGRAMMABLE READ-ONLY MEMORY AND MANUFACTURING METHOD THEREFOR

[75] Inventors: Eiichi Arima; Akira Nishimoto; Shinichi Jintate; Kazuo Sudo; Kazutoshi Oku, all of Hyogo, Japan

[73] Assignee: Mitsubishi Denki Kabushiki Kaisha, Tokyo, Japan

[21] Appl. No.: 241,887

[22] Filed: Sep. 8, 1988

[30] Foreign Application Priority Data

Sep. 9, 1987 [JP] Japan .................. 62-225910

[51] Int. Cl.$^5$ ............... H01L 29/68; H01L 29/78
[52] U.S. Cl. .................... 257/320; 257/914
[58] Field of Search ............ 357/23.5, 49, 54; 437/43, 109; 257/320

[56] References Cited

U.S. PATENT DOCUMENTS

| | | |
|---|---|---|
| 4,099,196 | 7/1978 | Simko . |
| 4,302,766 | 11/1981 | Guterman . |
| 4,554,180 | 11/1985 | Hirooka .................. 427/248.1 |
| 4,766,477 | 8/1988 | Nakagawa et al. ............ 357/59 |

OTHER PUBLICATIONS

"Organic Chemistry"; 4th ed., Morrison et al. ©1983 p. 30.
"Characterization of Thermally Oxidized n+ Polycrystalline Silicon", IEEE Trans. vol. Ed-32 No. 3 3-85 pp. 577-583.
J. of Appl. Phys.: "Evidence for Surface Asperity Mechanism of Conductivity in Oxide Grown on Polycrystalline Silicon" by R. M. Anderson et al, vol. 48, No. 11, Nov. 1977 pp. 4834-4836.

Primary Examiner—Andrew J. James
Assistant Examiner—D. Monin
Attorney, Agent, or Firm—Lowe, Price, LeBlanc & Becker

[57] ABSTRACT

A method for manufacturing an EEPROM comprises the step of using raw gas containing an organic compound having a molecular weight of more than 44, such as ethyl acetate and tetrahydrofuran when a first polysilicon layer serving as a select gate electrode and a second polysilicon layer serving as a floating gate electrode are deposited by a CVD process. The above described step allows a voltage at the time of tunneling electrons to be decreased.

3 Claims, 5 Drawing Sheets

ELECTRICAL ERASABLE AND PROGRAMMABLE READ-ONLY MEMORY AND MANUFACTURING METHOD THEREFOR

BACKGROUND OF THE INVENTION

1. Field of the Invention

The present invention relates generally to an electrical erasable and programmable read-only memory (referred to as EEPROM hereinafter) and a manufacturing method therefor, particularly to reducing the programming voltages therefor.

2. Description of the Prior Art

In the description of the prior art, the U.S. Pat. No. 4,099,196 issued Jul. 4, 1978, entitled "Triple Layer Polysilicon Cell", assigned to Intel Corporation is incorporated by reference.

FIG. 1 is a cross sectional view showing a single cell of a conventional EEPROM having a triple gate structure which is disclosed in the above mentioned U.S. Pat. No. 4,099,196.

The EEPROM having a triple gate structure comprises a first polysilicon (polycrystalline silicon) gate electrode 3 formed on a silicon substrate 1 through a first gate oxide film 2 for writing information charge, a second polysilicon gate electrode 5 formed on the first polysilicon gate electrode 3 through a first polysilicon gate oxide film 4 and serving as a floating gate electrode, a third polysilicon gate electrode 7 formed on the second polysilicon gate electrode 5 through a second polysilicon gate oxide film 6 to overlap with at least a portion of the second polysilicon gate electrode 5 for controlling writing and erasing of the information charge, and a fourth polysilicon gate electrode 8 for erasing the information charge.

Operation is now described. When data is written, the EEPROM having a triple gate structure applies a voltage of approximately 25 V to the third polysilicon gate electrode 7 and the fourth polysilicon gate electrode 8, and the first polysilicon gate electrode 3 is grounded. As a result, electrons are injected from the first polysilicon gate electrode 3 to the second polysilicon gate electrode 5 by tunneling. In addition, when data is erased, the first polysilicon gate electrode 3 and the third polysilicon gate electrode 7 are grounded, and a voltage of approximately 25 V is applied to the fourth polysilicon gate electrode 8. As a result, electrons deposited on the second polysilicon gate electrode 5 are injected to the fourth polysilicon gate electrode 8 by tunneling. The oxide films 4 and 6 on the first polysilicon gate electrode 3 and the second polysilicon gate electrode 5 are approximately 1000° Å. Since electrons tunnel through the oxide films 4 and 6 at approximately 25V, the EEPROM having a triple gate structure is formed such that a portion from which information charge is emitted, of the polysilicon layers 3 and 5 serving as electrodes, has a rough surface. The rough surface allows tunneling of electrons even at a relatively low voltage.

Conventionally, the following approaches have been employed so that the surface of the portion from which information charge is emitted, of the first polysilicon gate electrode 3 and the second polysilicon gate electrode 5 easily becomes rough.

(1) A first polysilicon gate oxide film is formed by thermal oxidation at a low temperature. (For the fact that the surface of polysilicon becomes rough more easily by thermal oxidation at a low temperature, see an article by R. M. Anderson et al., entitled "Evidence for surface asperity mechanism of conductivity in oxide grown on polycrystalline silicon", J. of Applied Physics, Vol. 48, No 11, November, 1977.)

(2) The concentration of implanting conductive impurities into polysilicon serving as a first polysilicon gate and a second polysilicon gate is decreased.

Description is now made on a method for manufacturing the EEPROM. FIGS. 2A to 2E are diagrams showing the sequential steps of the manufacturing method for the conventional EEPROM.

A p type silicon substrate 1 is prepared (FIG. 2A). A first gate oxide film 2 is then formed on the silicon substrate 1 (FIG. 2B). A polysilicon layer 8 with the concentration of conductive impurities decreased is then formed on the first gate oxide film 2 to be a first polysilicon layer 3 (FIG. 2C). A first polysilicon gate oxide film 4 is formed in the upper and side portions of the first polysilicon layer 3 by thermal oxidation, and a second polysilicon gate electrode 5 with the impurity concentration decreased is formed thereon (FIG. 2D). A second polysilicon gate oxide film 6 is formed in the upper and side portions of the second polysilicon gate electrode 5 by thermal oxidation, and a third polysilicon gate electrode 7 and a fourth polysilicon gate electrode 8 are formed thereon.

The manufacturing method for the conventional EEPROM having a triple gate structure comprises the steps of, for example, decreasing the concentration of impurities contained in polysilicon and decreasing the thermal oxidation temperature of a gate oxide film so that the first polysilicon gate electrode and the second polysilicon gate electrode have rough surfaces. However, it is difficult to make uniform the concentration of impurities contained in polysilicon within the surface of the silicon substrate. Therefore, the rough surfaces of the polysilicon cannot be made uniform. Thus, electric characteristics are not kept constant, yield of the EEPROM is decreased and the reliability is decreased.

SUMMARY OF THE INVENTION

An object of the present invention is to provide an improved EEPROM and a manufacturing method therefor.

Another object of the present invention is to reduce the programming voltage of an EEPROM.

Another object of the present invention is to provide a method for manufacturing a semiconductor memory device in which electrons can tunnel through an oxide film of approximately 1000° Å at a low voltage, irrespective of the concentration of impurities in polysilicon and the thermal oxidation temperature on polysilicon.

The semiconductor memory device according to the present invention comprises a semiconductor substrate having a major surface and a predetermined impurity concentration of a particular conductivity type, an insulating layer formed on the major surface of said semiconductor substrate, a first gate electrode comprising polysilicon containing an organic compound having a molecular weight of more than 44 formed on said insulating layer, and a second gate electrode comprising polysilicon containing an organic compound having a molecular weight of more than 44 and covering at lease a part of said first gate electrode while being insulated from said first gate electrode.

In the manufacturing method for the semiconductor memory device according to the present invention, when a polysilicon gate having a low breakdown voltage such as a first polysilicon gate electrode and a second polysilicon gate electrode is formed, an organic compound having a molecular weight of more than 44 is contained in raw gas for growing polysilicon, such as silane gas.

These objects and other objects, features, aspects and advantages of the present invention will become more apparent from the following detailed description of the present invention when taken in conjunction with the accompanying drawings.

DESCRIPTION OF THE PREFERRED EMBODIMENTS

An organic compound having a molecular weight of more than 44 in raw gas reduces the voltage which causes electrons to tunnel through an oxide film formed between polysilicon gate electrodes by thermal oxidation.

Figure 1:
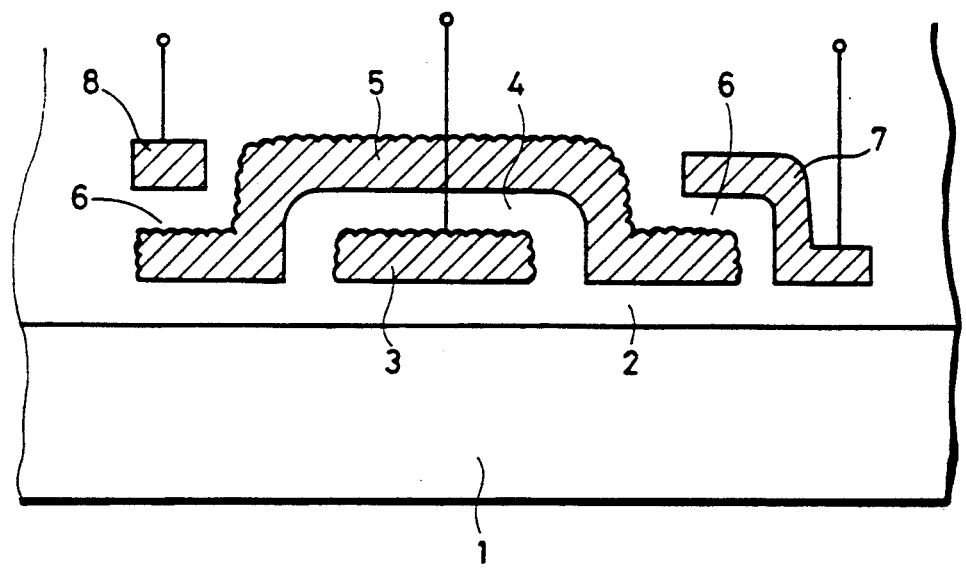
FIG. 1 is a diagram showing a conventional EEPROM having a triple gate structure.
Figure 2A:
FIGS. 2A to 2E are diagrams showing processes in a manufacturing method for the conventional EEPROM having a triple gate structure.
Figure 2B:
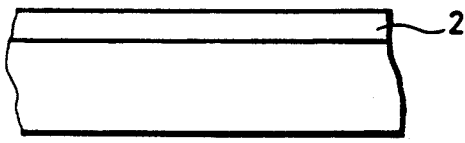
Figure 2C:
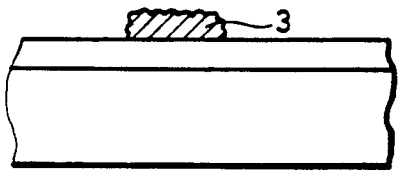
Figure 2D:
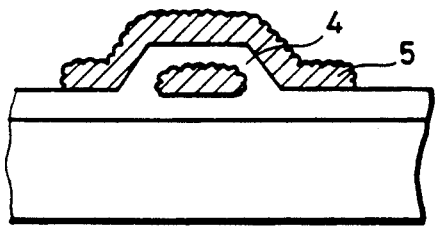
Figure 2E:
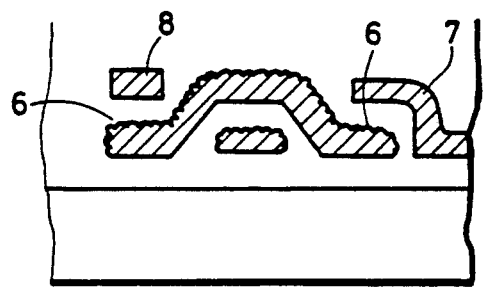
Figure 3:
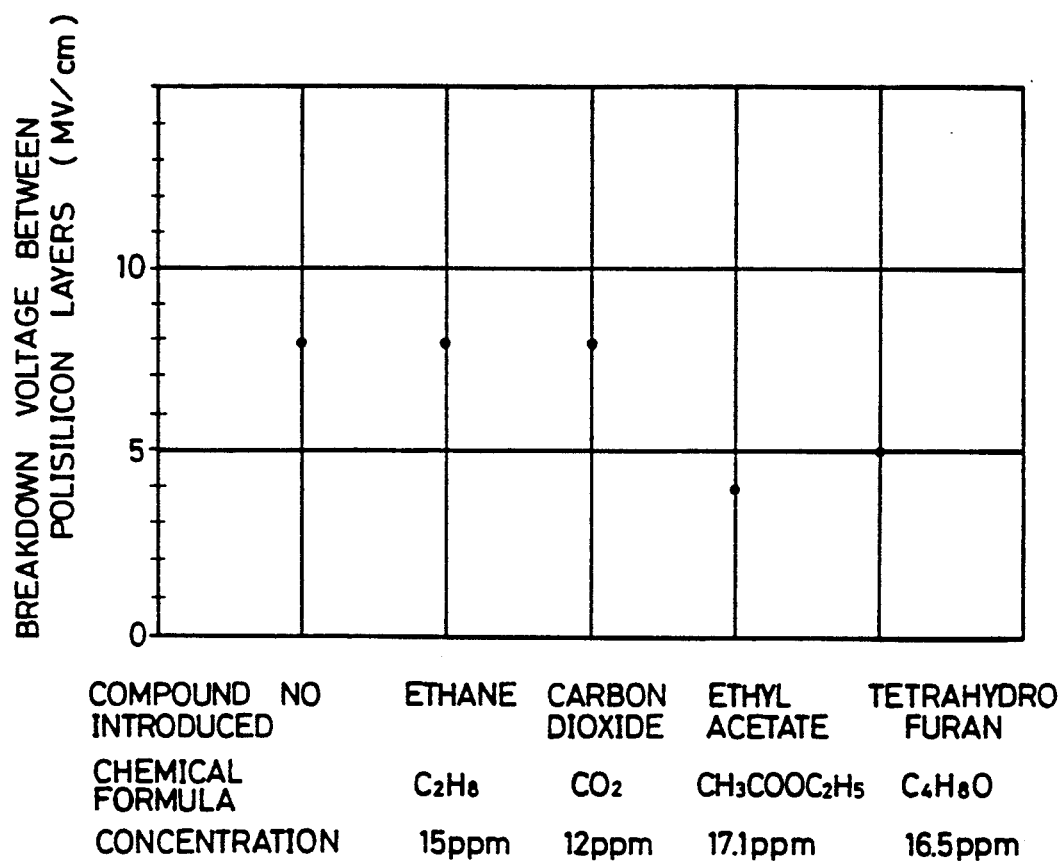
FIG. 3 is a diagram showing the relation between a compound introduced into silane gas and the breakdown voltage between polysilicon.

Referring now to FIG. 3, the above mentioned phenomenon is described. FIG. 3 is a graph, axis of abscissa of which represents a compound introduced into silane gas and axis of ordinate of which represents the breakdown voltage between polysilicon layers with the oxide film interposed therebetween. The graph shows the relation between a compound introduced into silane gas and the breakdown voltage between the polysilicon layers.

In this case, the condition of forming polysilicon is as follows: the temperature is 600° to 650° C., the thickness of an insulating layer between polysilicon is 900° to 1000° Å, the surface is not rough and the concentrations of compounds contained in silane gas are described in FIG. 3.

In addition, the breakdown voltage is represented by the voltage generated when current of $0.5\mu$ Å flows between polysilicon.

From FIG. 3, the following is seen.

(1) When foreign matter is not contained in silane gas, the breakdown voltage is about 8 MV/cm. When 17.1 ppm of ethyl acetate (molecular weight 88) is contained, the breakdown voltage is reduced to about 4 MV/cm. In addition, when 16.5 ppm of tetrahydrofuran (molecular weight 72 ppm) is contained, the breakdown voltage is reduced to about 5 MV/cm.

(2) When carbon dioxide (molecular weight 44) and ethane (molecular weight 30) are contained, the effect is not recognized.

(3) In the foregoing, when an organic compound having a molecular weight of more than 44 is contained, the breakdown voltage between polysilicon can be reduced.

Referring now to FIGS. 4 and 5A to 5E, description is made an embodiment of the present invention.

Figure 4:
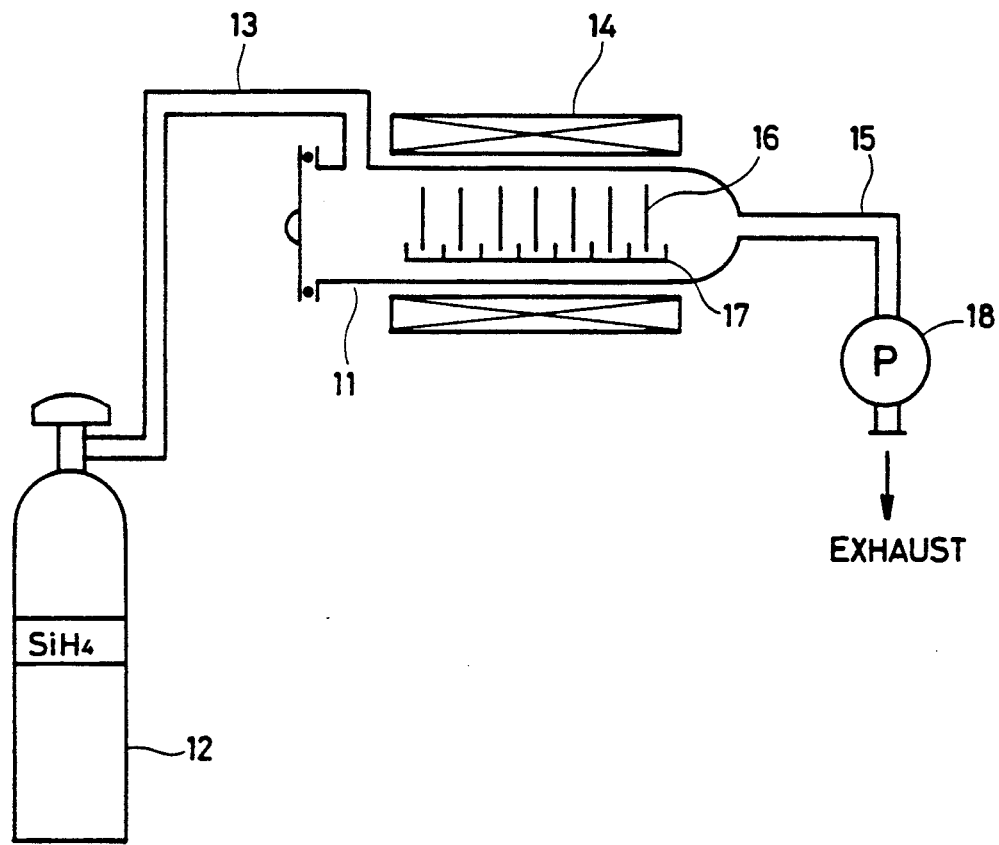
FIG. 4 is a schematic illustration of a CVD equipment used to deposit polysilicon on a wafer according to an embodiment of the present invention.

FIG. 4 is a schematic illustration of a CVD equipment used for implementing a manufacturing method for an EEPROM according to the present invention. The CVD equipment comprises a reaction tube 11, a gas piping 13 for supplying raw gas 12 to the reaction tube 11, a heater 14 arranged around the reaction tube 11, a vacuum pump 18 for exhausting air in the reaction tube 11, and an exhaust piping 15. Wafers 16 having polysilicon layers deposited thereon are mounted on a board 17 and held in the reaction tube 11.

The condition of depositing polysilicon for implementing the present invention is as follows: the degree of vacuum is 0.1 to 0.5 Torr. The temperature is 600° to 650° C. The raw gas is silane gas and the flow rate thereof is 100 to 200 cc/min, preferably, 150 cc/min.

Figure 5A:
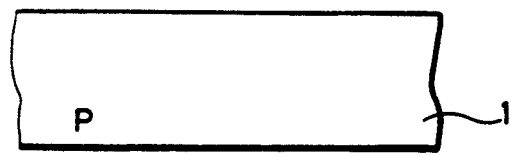
FIGS. 5A to 5E are cross sectional views showing processes of a manufacturing method for a semiconductor memory device according to an embodiment of the present invention.
Figure 5B:
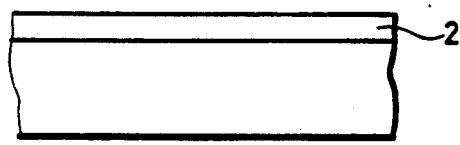
Figure 5C:
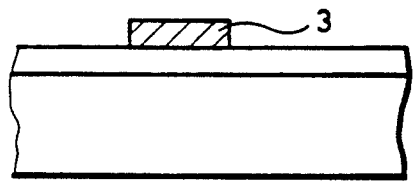
Figure 5D:
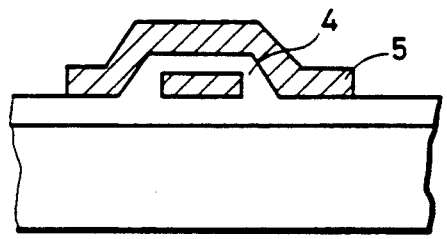
Figure 5E:
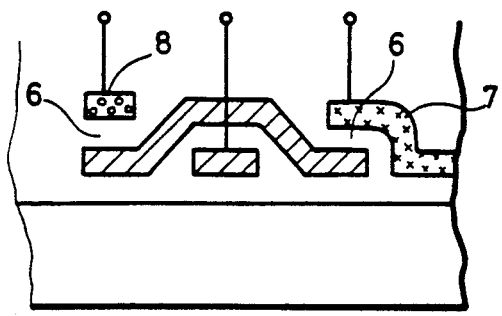

FIG. 5A to 5E are diagrams showing the sequential steps of a method for manufacturing a semiconductor memory device according to the present invention. A first gate oxide film 2 is formed on a silicon substrate 1 by thermal oxidation (FIGS. 5A and 5B). A first polysilicon layer serving as a write and select gate electrode is then deposited by chemical vapor deposition (FIG. 5C). When the first polysilicon layer is deposited, a compound having a molecular weight of more than 44 comprising oxygen, hydrogen or carbon, such as ethyl acetate and tetrahydrofuran is introduced into raw gas such as silane gas. After conductive impurities are added to the polysilicon layer to form a first polysilicon gate electrode 3, a first polysilicon gate oxide film 4 is formed by thermal oxidation. Thereafter, a second polysilicon gate electrode 5 serving as a floating gate electrode is formed (FIG. 5D). On this occasion, a compound having a molecular weight of more than 44 comprising oxygen, hydrogen or carbon, such as ethyl acetate and tetrahydrofuran is also introduced into raw gas such as silane gas, so that a polysilicon layer is deposited by chemical vapor deposition. Conductive impurities are added to the polysilicon layer, so that a second polysilicon gate electrode 5 is formed by photolithography and etching. A second polysilicon gate oxide film 6 is formed thereon again by thermal oxidation. A third polysilicon gate electrode 7 and a fourth polysilicon gate electrode 8 are deposited by chemical vapor deposition, so that a control gate electrode and an erase gate electrode are formed (FIG. 5E).

When the first polysilicon layer and the second polysilicon layer are deposited, a compound having a molecular weight of more than 44 comprising hydrogen, oxygen or carbon is introduced into raw gas such as silane gas to form the first and second polysilicon gate electrodes 3 and 5. The first and second polysilicon gate oxide films 4 and 6 are formed thereon by thermal oxidation. As a result, the voltage which causes tunneling of electrons stored in the first and second polysilicon gate electrodes 3 and 5 is reduced. Therefore, electrons can be injected from the first polysilicon gate electrode 3 to the second polysilicon gate electrode 5 or from the second polysilicon gate electrode 5 to the third polysilicon gate electrode 7 at a voltage of approximately 25 V even if the thicknesses of the polysilicon oxide films between silicon gate electrodes are about 1000° Å. In addition, uniform electric characteristics are obtained using this method, irrespective of variation in the concentration of impurities in polysilicon.

In addition to the above described embodiment, the present invention can be applied to a nonvolatile semiconductor memory device in which n or p type source and drain are formed on the major surface of a silicon substrate, so that electrons are injected into a floating gate by hot electrons produced by avalanche breakdown in the silicon substrate and electrons are emitted from the floating gate by applying electric field between the first polysilicon gate electrode and the control gate electrode (which is disclosed in U.S. Pat. No. 4,302,766 issued Nov. 24, 1981, entitled "Self-Limiting Erasable Memory Cell with Triple Level Polysilicon", assigned to T.I.).

Furthermore, the present invention is effective for all of semiconductor devices which require to reduce the breakdown voltage of an oxide film on a polysilicon gate.

As described in the foregoing, according to the present invention, when a polysilicon layer is formed, an organic compound having a molecular weight of more than 44 is introduced, so that the voltage at the time of injecting electrons into the oxide film formed on the polysilicon layer is reduced. Therefore, a method for manufacturing a semiconductor memory device can be obtained which permits tunneling of electrons through an oxide film of approximately 1000° Å at a low voltage, irrespective of the concentration of impurities in polysilicon and the thermal oxidation temperature on polysilicon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low break-down voltage semiconductor memory device, comprising
    a semiconductor substrate having a major surface and a predetermined impurity concentration of a particular conductivity type;
    an insulating layer formed on the major surface of the semiconductor substrate;
    a first gate electrode formed on the insulating layer, the first gate electrode comprising polysilicon subjected in the presence of an organic compound selected from the group consisting of ethyl acetate and tetrahydrofuran to conditions effective to form a low break-down voltage polysilicon; and
    a second gate electrode covering at least a part of the first gate electrode and being insulated therefrom, the second gate electrode comprising polysilicon subjected in the presence of an organic compound selected from the group consisting of ethyl acetate and tetrahydrofuran to conditions effective to form a low break-down polysilicon.

2. A semiconductor memory device, comprising
    a semiconductor substrate having a major surface and a predetermined impurity concentration of a predetermined conductivity type;
    an insulating layer formed on the major surface of the semiconductor substrate;
    a first gate electrode formed on the insulating layer, the first gate electrode comprising polysilicon prepared in the presence of an organic compound selected from the group consisting of ethyl acetate and tetrahydrofuran; and
    a second gate electrode covering at least a part of the first gate electrode and being insulated therefrom, the second gate electrode comprising low breakdown voltage polysilicon prepared in the presence of an organic compound selected from the group consisting of ethyl acetate and tetrahydrofuran; the device prepared by a method comprising
    preparing a semiconductor substrate having a major surface and a predetermined impurity concentration of a specified conductivity type;
    forming an insulating layer on the major surface of the semiconductor substrate;
    forming a first gate electrode by placing polysilicon on the insulating layer in the presence of a gas comprising an organic compound selected from the group consisting of ethyl acetate and tetrahydrofuran under conditions effective to form a low breakdown voltage polysilicon; and
    forming a second gate electrode by placing polysilicon on at least apart of the first gate electrode in the presence of a gas comprising an organic compound selected from the group consisting of ethyl acetate and tetrahydrofuran under conditions effective to form a low break-down voltage polysilicon, while insulating it therefrom.

3. A semiconductor memory device having a floating gate electrode, comprising
    a semiconductor substrate having a major surface and a predetermined impurity concentration of a predetermined conductivity type;
    an insulating layer formed on the major surface of the semiconductor substrate;
    a write and select gate electrode formed on the insulating layer, the write and select gate electrode comprising polysilicon subjected in the presence of an organic compound selected from the group consisting of ethyl acetate and tetrahydrofuran to conditions effective to form a low break-down voltage polysilicon;
    a floating gate electrode covering at least a part of the write and select gate electrode but insulated therefrom, the floating gate electrode comprising polysilicon subjected in the presence of an organic compound selected from the group consisting of ethyl acetate and tetrahydrofuran to conditions effective to form a low break-down voltage polysilicon;
    a control gate electrode comprising polysilicon covering a part of the floating gate electrode and being insulated from the write and select and the floating gate electrodes; and
    an erase gate electrode comprising polysilicon covering at least a part of the floating gate electrode and being insulated from the write and select gate electrode, the floating gate electrode and the control gate electrode.

* * * * *